(12) United States Patent
Nakamura et al.

(10) Patent No.: US 7,467,337 B2
(45) Date of Patent: Dec. 16, 2008

(54) SEMICONDUCTOR MEMORY DEVICE

(75) Inventors: Toshikazu Nakamura, Kawasaki (JP); Akira Kikutake, Kawasaki (JP); Kuninori Kawabata, Kawasaki (JP); Yasuhiro Onishi, Kawasaki (JP); Satoshi Eto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 343 days.

(21) Appl. No.: 11/102,715

(22) Filed: Apr. 11, 2005

(65) Prior Publication Data
US 2006/0156192 A1 Jul. 13, 2006

(30) Foreign Application Priority Data
Dec. 22, 2004 (JP) .............................. 2004-370316

(51) Int. Cl.
*G06F 11/00* (2006.01)
(52) U.S. Cl. .................... 714/704; 714/718; 714/710
(58) Field of Classification Search ................ 714/704, 714/710, 718, 766, 744; 365/200–201
See application file for complete search history.

(56) References Cited

U.S. PATENT DOCUMENTS

| | | | |
|---|---|---|---|
| 4,958,352 A | 9/1990 | Noguchi et al. | |
| 5,267,242 A * | 11/1993 | Lavallee et al. | 714/7 |
| 5,361,227 A * | 11/1994 | Tanaka et al. | 365/185.22 |
| 5,434,868 A * | 7/1995 | Aichelmann et al. | 714/718 |
| 5,867,642 A * | 2/1999 | Vivio et al. | 714/8 |
| 6,223,311 B1 * | 4/2001 | Katayama et al. | 714/718 |
| 6,339,546 B1 | 1/2002 | Katayama et al. | |
| 6,480,982 B1 * | 11/2002 | Chan et al. | 714/764 |
| 6,976,197 B2 * | 12/2005 | Faust et al. | 714/723 |
| 7,099,190 B2 * | 8/2006 | Noguchi et al. | 365/185.09 |

FOREIGN PATENT DOCUMENTS

| | | |
|---|---|---|
| JP | 49-60450 A | 6/1974 |
| JP | 01-094599 A | 4/1989 |
| JP | 5-4266 U | 1/1993 |
| JP | 06-131884 A | 5/1994 |
| WO | 0122232 A1 | 3/2001 |

* cited by examiner

*Primary Examiner*—M. Mujtaba K. Chaudry
*Assistant Examiner*—Steve Nguyen
(74) *Attorney, Agent, or Firm*—Arent Fox LLP (57) ABSTRACT

Disclosed is a semiconductor memory device capable of arbitrarily setting an upper limit of the number of error corrections during a test operation. The semiconductor memory device has a counter, a register, and a comparison circuit. The counter counts the number of error corrections. The register, when an upper limit setting signal is externally inputted to change the upper limit of the number of error corrections, changes the upper limit. The comparison circuit compares the number of error corrections with the changed upper limit.

5 Claims, 9 Drawing Sheets

SEMICONDUCTOR MEMORY DEVICE

CROSS-REFERENCE TO RELATED APPLICATIONS

This application is based upon and claims the benefits of priority from the prior Japanese Patent Application No. 2004-370316, filed on Dec. 22, 2004, the entire contents of which are incorporated herein by reference.

BACKGROUND OF THE INVENTION

1. Field of the Invention

The present invention relates to a semiconductor memory device, and particularly to a semiconductor memory device having an error correction function.

2. Description of the Related Art

In a semiconductor memory device such as a DRAM (Dynamic Random Access Memory) mounted on computer equipments, a necessary memory capacity rapidly increases in recent years. In response to the increase in memory capacity, a miniaturization technique progresses. However, when the miniaturization technique progresses, reliability in a memory cell is reduced. In order to prevent the reduction in reliability, the following redundant technique has been used. An extra memory region (redundant region) is provided in a memory cell array. In place of a defective memory cell in a normal memory cell array region, a non-defective memory cell in the redundant region is selected to relieve defects. According to this technique, although the reduction in the reliability of products themselves can be prevented, the following problem occurs in recent years. In the memory cell requiring a refresh operation, such as a DRAM cell, a data retention time is suddenly degraded, and thereby defects occur after packaging or shipping of products.

One example of countermeasures for the defects caused by data retention time degradation includes a method of mounting an ECC (Error Checking and Correcting) function. In the method of mounting a commonly used ECC function capable of 1-bit error correction, even when read-out data have an error of 1-bit, the error can be corrected using the ECC function. Further, a method of mounting the ECC function to allow it to take over the repair of defects by the redundant technique is also considered. More specifically, when the error within the ECC code (e.g., hamming code) is a 1-bit error, the error correction is performed by each read-out operation in a state of a 1-bit error without using the redundant region.

Therefore, a single-bit defect (it means a defect that not two or more defects but only one defect is generated by one read-out operation due to BL (bit line) short/open) to some extent can be repaired without using the redundant region. As a result, even defective chips which are heretofore discarded due to excessive amounts of defective bits that cannot be repaired using a predetermined redundant region can be changed into non-defective chips. Therefore, this can contribute to improvement in the yield.

However, when the number of single-bit defects of which the repair by the redundant technique can be taken over by the ECC function is too large, a probability of repair defective bits caused by a data retention time degradation is reduced. Accordingly, what becomes important here is as follows. The first point is that the number of defective bits of which the repair by the redundant technique can be taken over by the ECC function is determined at the time of packaging or shipping chips as products. The second point is that the test operation can be performed.

For that purpose, a semiconductor memory device having a counter, a register, a comparison circuit, and an output circuit is required. Each element has the following function. The counter can count the number of error corrections. The register can set the upper limit of the number of error corrections. The comparison circuit can compare values of the counter with those of the register. The output circuit can output the comparison results.

The semiconductor memory device having the above-described functions is disclosed, for example, in Japanese Unexamined Patent Publication No. 49-60450 (p. 3, FIG. 2), Japanese Unexamined Patent Publication No. 1-94599 (pp. 4-5, FIG. 1), and Japanese Unexamined Patent Publication No. 6-131884 (paragraph numbers [0006] to [0008], and FIG. 1). The semiconductor memory device has the following configuration.

Figure 9:
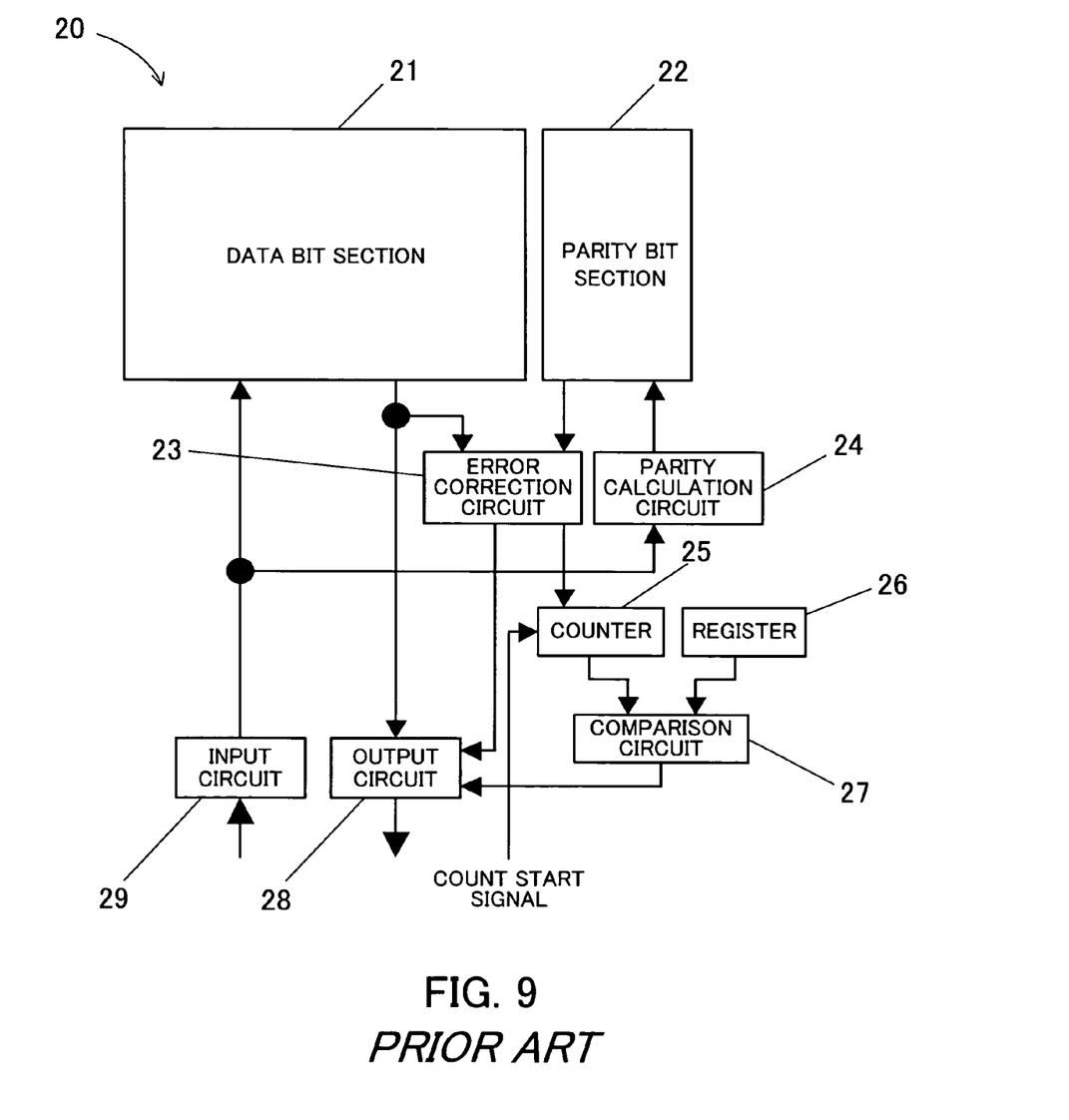
FIG. 9 shows a configuration of a conventional semiconductor memory device.

FIG. 9 shows a configuration of a conventional semiconductor memory device.

A conventional semiconductor memory device 20 has a data bit section 21, a parity bit section 22, an error correction circuit 23, a parity calculation circuit 24, a counter 25, a register 26, a comparison circuit 27, an output circuit 28 and an input circuit 29. The data bit section 21 stores a data bit out of data stored in a memory cell array comprised of memory cores (not shown). The parity bit section 22 stores a parity bit out of data stored in a memory cell array comprised of memory cores (not shown). The error correction circuit 23 performs an error correction with reference to the data bit and the parity bit. The parity calculation circuit 24 generates a parity bit according to input data, for example, by the operation based on a hamming code. The counter 25 counts the number of error corrections. The register 26 stores an upper limit of the number of error corrections. The comparison circuit 27 compares the counted number of error corrections with the upper limit of the number of error corrections stored in the register 26.

In the conventional semiconductor memory device 20, the error correction circuit 23 performs a 1-bit error detection and a 1-bit error correction with reference to, for example, 64 data bits and 7 parity bits. When detecting a defective bit, the circuit 23 inverts the bit for the error correction and then, outputs the results through the output circuit 28. The counter 25 counts the number of error corrections when a count start signal is inputted during the test operation. The comparison circuit 27 compares the number of error corrections with the upper limit of the number of error corrections previously stored in the register 26, and thereby judging whether or not the number of error corrections exceeds a predetermined upper limit. When the number of error corrections exceeds the upper limit, the output circuit 28 generates an alarm.

The conventional semiconductor memory device, however, has some problems as described hereinbelow. The first problem is as follows. Even if the number of error corrections counted during the test operation is too large or too small with respect to the set upper limit, the upper limit cannot be arbitrarily set. This upper limit is an upper limit of the number of the defective bits of which the repair by the redundant technique can be taken over by the ECC function. Accordingly, defective bits beyond the upper limit are repaired by the redundant region. Therefore, the second problem is as follows. When the upper limit is too small, many redundant regions are required depending on the number of error corrections. On the contrary, when the upper limit is too large, a probability of relieving the defective bits caused by a data retention time degradation is reduced in the case where the number of error corrections is large.

The third problem is as follows. Due to deterioration with time of the memory cell, the number of the defective bits after the packaging or shipping increases more than that during the test operation in some cases. Despite this, there is no section for grasping this situation.

The fourth problem is as follows. Depending on the test pattern, the same address data are accessed two or more times in some cases and at this time, the defective bit is carelessly counted two or more times.

SUMMARY OF THE INVENTION

In view of the foregoing, it is an object of the present invention to provide a semiconductor memory device capable of arbitrarily setting an upper limit of the number of error corrections during a test operation.

It is another object of the present invention to provide a semiconductor memory device capable of grasping an increase of defective bits due to deterioration with time of a memory cell.

It is yet another object of the present invention to provide a semiconductor memory device capable of correctly counting the number of error corrections.

To accomplish the above-described objects, according to one aspect of the present invention, there is provided a semiconductor memory device having an error correction function that corrects a defective bit. This semiconductor memory device comprises the following elements: a counter that counts the number of error corrections; an upper limit setting section that changes an upper limit of the number of error corrections in response to an upper limit setting signal inputted externally; and a comparator that compares the number of error corrections with the upper limit.

According to another aspect of the present invention, there is provided a semiconductor memory device having an error correction function that corrects a defective bit. This semiconductor memory device comprises the following elements: a counter that counts the number of error corrections; an upper limit setting section that, when an upper limit setting signal is inputted externally, sets a count result of the number of error corrections in the counter as an upper limit of the number of error corrections; and a comparator that compares the upper limit with the count result in the counter after the passing of a predetermined time.

According to yet another aspect of the present invention, there is provided a semiconductor memory device having an error correction function that corrects a defective bit. This semiconductor memory device comprises the following elements: a counter that counts the number of error corrections; an upper limit setting section that stores an upper limit of the number of error corrections and that, when an upper limit setting signal is externally inputted after completion of the counting in the counter, increments or decrements the upper limit in synchronization with a clock signal; and a comparator that compares a count result in the counter with the upper limit.

According to yet another aspect of the present invention, there is provided a semiconductor memory device having an error correction function that corrects a defective bit. This semiconductor memory device comprises the following element: an error correction memory section that stores error correction information of whether or not the error correction is performed, at every combination of data bits and parity bits required to construct a code capable of 1-bit error correction.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Preferred embodiment of the present invention will be described in detail below with reference to the accompanying drawings, wherein like reference numerals refer to like elements throughout.

Figure 1:
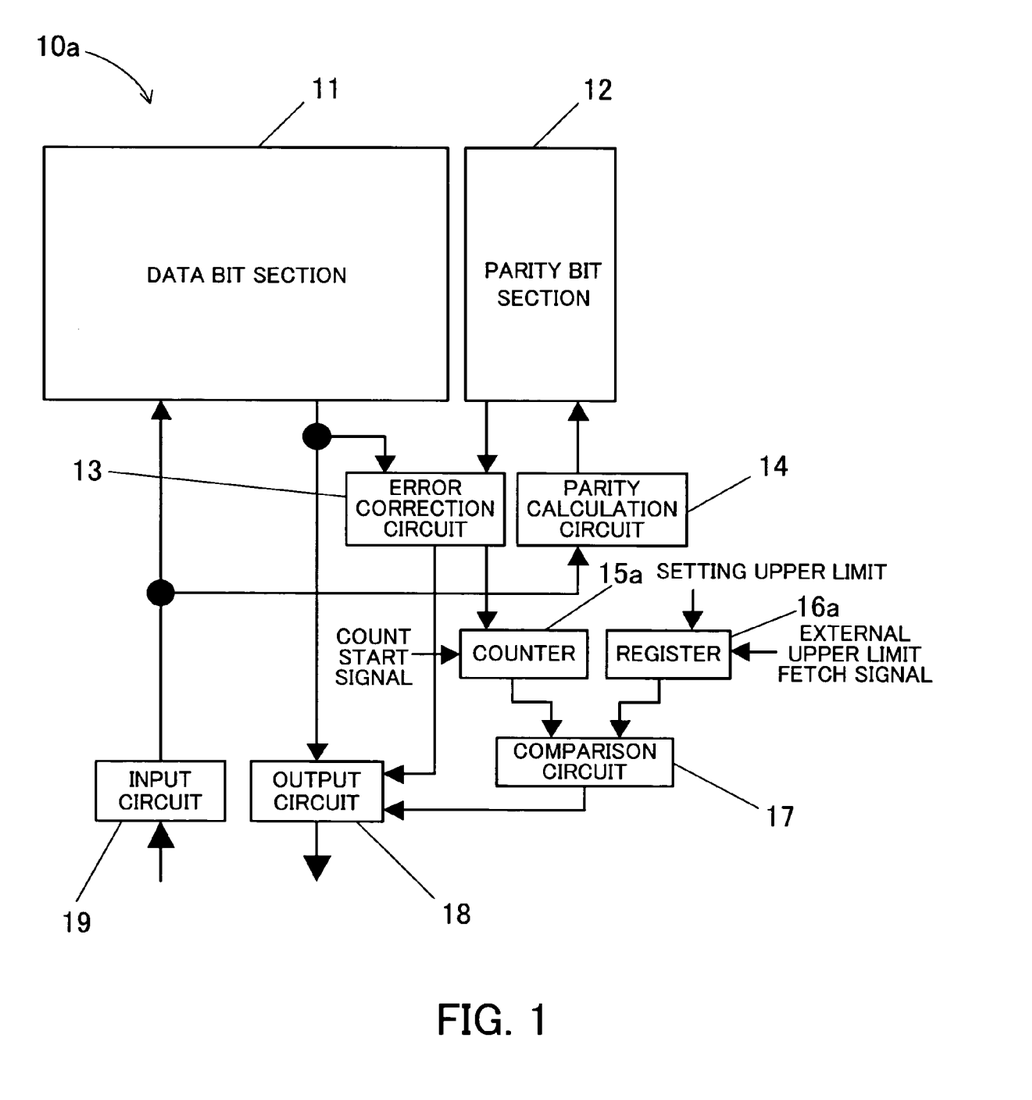
FIG. 1 shows a configuration of a semiconductor memory device according to a first embodiment of the present invention.

FIG. 1 shows a configuration of a semiconductor memory device according to a first embodiment of the present invention.

The semiconductor memory device 10a of the first embodiment has the following elements: a data bit section 11 that stores a data bit; a parity bit section 12 that stores a parity bit; an error correction circuit 13 that performs an error correction with reference to the data bit and the parity bit; a parity calculation circuit 14 that generates a parity bit in response to input data by the calculation based on, for example, a hamming code; a counter 15a that counts the number of error corrections; a register 16a that sets an upper limit of the number of error corrections; a comparison circuit 17 that compares the counted number of error corrections with the upper limit of the number of error corrections stored in the register 16a; an output circuit 18; and an input circuit 19.

The data bit section 11 and the parity bit section 12 each are configured by memory cell arrays comprised of memory cores (not shown). The memory cell array is configured by a 4-bit or 8-bit unit such that four or eight memory cells are selected on one column selection line.

A sense amplifier, a write amplifier, or a column decoder or row decoder that specifies an address is omitted in the figure.

In the semiconductor memory device 10a of the first embodiment, the register 16a that stores the upper limit of the number of error corrections is different from that of a conventional semiconductor memory device. More specifically, the register 16a changes the upper limit in response to the upper limit setting signal (which is hereinafter referred to as an "external upper limit fetch signal" in the first embodiment) inputted externally. A setting upper limit is fetched in the register 16a through data input/output pins (not shown), for example, when the external upper limit fetch signal goes to a high level during the test operation. The upper limit is an upper limit of the number of defective bits of which the repair by the redundant technique can be taken over by the ECC function.

Operations of the semiconductor memory device 10a are described below.

At the time of data writing, data inputted from the data input/output pins (not shown) are stored in a specified address in the data bit section 11 through the input circuit 19. On this occasion, the parity calculation circuit 14 generates a parity bit in response to input data by the calculation based on an ECC code (e.g., a hamming code). Then, the parity bit section 12 stores the generated parity bit in a predetermined address.

For example, when constructing the ECC code capable of 1-bit error correction, the following parity bits each are generated. The parity bits of 4 bits, 5 bits, 7 bits and 8 bits are generated for the data bits of 8 bits, 16 bits, 64 bits and 128 bits, respectively. Then, the generated parity bits are stored in the parity bit section 12.

On the other hand, at the time of data read-out operation, for example, the 64 data bits and 7 parity bits which are required to construct the ECC code are read out in one read-out operation from the addresses specified in the data bit section 11 and the parity bit section 12. On this occasion, the error correction circuit 13 performs a 1-bit error detection and a 1-bit error correction with reference to the data bits and the parity bits. When detecting a defective bit, the circuit 13 inverts the bit for the error correction and outputs the corrected data.

Next, operations during the test are described.

During the test operation, addresses are incremented or decremented according to a predetermined test pattern, so that all the address data of the data bit section 11 and the parity bit section 12 are accessed. The error correction circuit 13 performs a 1-bit error detection and a 1-bit error correction with reference to, for example, the 64 data bits and the 7 parity bits corresponding thereto, which are required to construct the ECC code. The counter 15a starts a counting operation of the number of error corrections when a count start signal inputted from an external pin goes to a high level during the test operation. At this time, a count value outputted from the counter and the upper limit of the number of error corrections stored in the register 16a are inputted into the comparison circuit 17 and compared. The comparison result in the comparison circuit 17 is outputted through the output circuit 18. When the count value in the counter 15a does not reach the upper limit set in the register 16a, the counter 15a continuously counts the number of error corrections. When the test using a predetermined test pattern is completed, for example, the count start signal inputted into the counter 15a goes to a low level and as a result, the counter 15a stops the counting operation of the number of error corrections. Further, when the count value in the counter 15a reaches the upper limit during the test operation, the output circuit 18 generates, for example, an alarm and as a result, the counter 15a stops the counting operation.

Incidentally, this upper limit is an upper limit of the number of defective bits of which the repair by the redundant technique can be taken over by the ECC function. Therefore, when the upper limit is too small, many redundant regions are required depending on the number of error corrections. On the contrary, when the upper limit is too large, a probability of relieving the defective bits caused by a data retention time degradation is reduced in the case where the number of error corrections is large. Therefore, the semiconductor memory device 10a of the first embodiment is configured such that the upper limit set in the register 16a can be adjusted during the test operation. More specifically, after completion of the counting of the number of error corrections, when the external upper limit fetch signal inputted goes to, for example, a high level, the register 16a fetches the setting upper limit from the data input/output pins (not shown) and sets it as a new upper limit.

The register 16a sets the upper limit, for example as follows. After completion of the counting of the number of error corrections, the register 16a changes the upper limit according to generation of an alarm. Based on whether or not the generation of an alarm changes by the change of the upper limit, the register 16a detects the approximate number of error corrections. In addition, the defective bit caused by the data retention time degradation is estimated. Thus, the upper limit is set. As a result, the upper limit can be set according to the number of error corrections during the test.

Next, the semiconductor memory device of a second embodiment is described.

Figure 2:
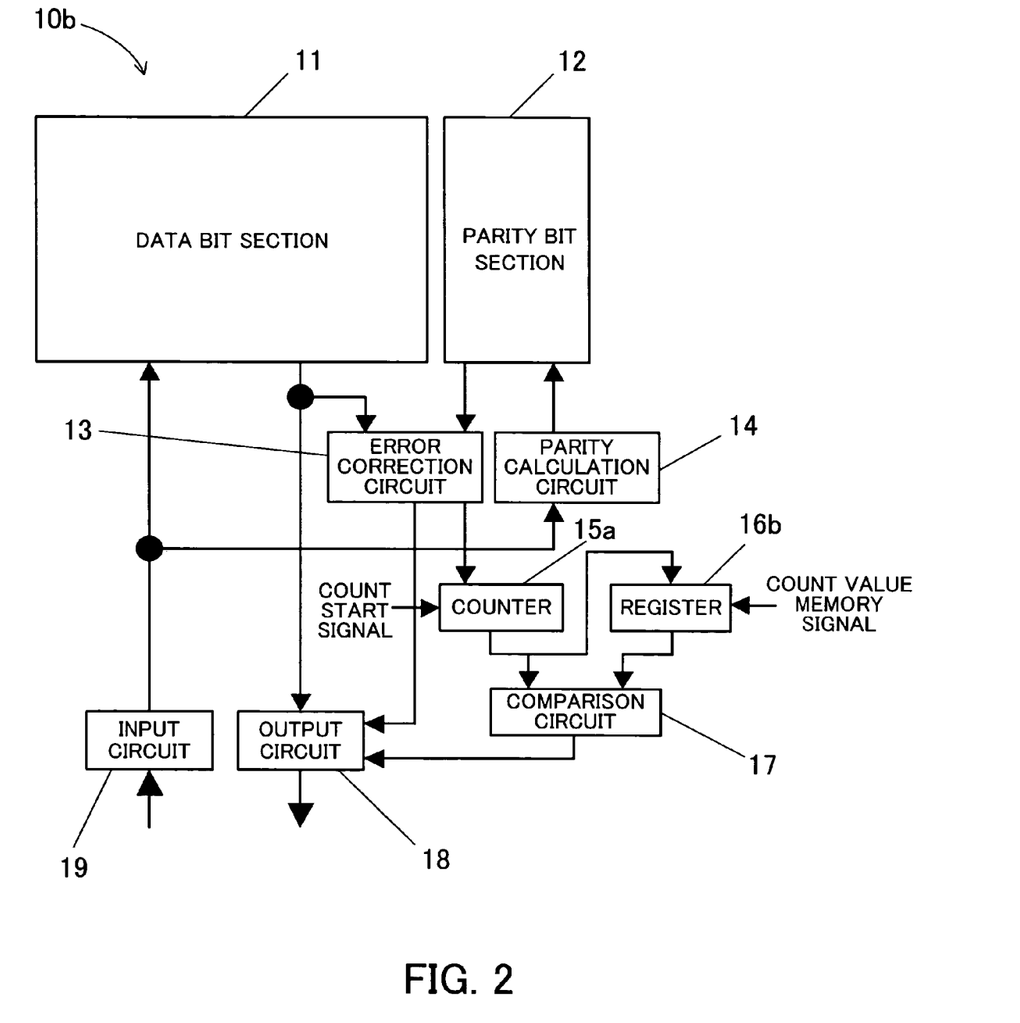
FIG. 2 shows a configuration of a semiconductor memory device according to a second embodiment of the present invention.

FIG. 2 shows a configuration of the semiconductor memory device according to the second embodiment of the present invention.

In the diagram, the same elements as those in the semiconductor memory device 10a of the first embodiment are indicated by the same reference numerals as in the device 10a and the description is omitted.

In the semiconductor memory device 10b of the second embodiment, a register 16b that sets an upper limit is different from the register 16a in the semiconductor memory device 10a of the first embodiment. When the upper limit setting signal (referred to as a "count value memory signal" in the second embodiment) is inputted (goes to a high level) externally, the register 16b sets a count result of the number of error corrections in the counter 15a as the upper limit of the number of error corrections.

Operations of the semiconductor memory device 10b of the second embodiment are described below. Operations during the reading and the writing are the same as those in the semiconductor memory device 10a of the first embodiment and the description is omitted.

During the test operation, after completion of counting of the number of error corrections by the counter 15a, when the count value memory signal goes to, for example, a high level, the register 16b stores the count result. After passing of a predetermined time in which a stress test is performed, a test is performed again by using the same test pattern as that used in a previous test. The comparison circuit 17 compares the previous count result which is set in the register 16b with this count result which is outputted from the counter 15a. When this count result increases more than the previous one, the output circuit 18 generates, for example, an alarm. Therefore, deterioration with time can be grasped.

In addition, the semiconductor memory device 10a of the first embodiment may be configured as follows. The count value memory signal is allowed to be inputted into the register 16a. When the signal goes to a high level, the register 16a stores the count value in the counter 15a instead of fetching the upper limit externally.

Next, a semiconductor memory device of a third embodiment is described.

Figure 3:
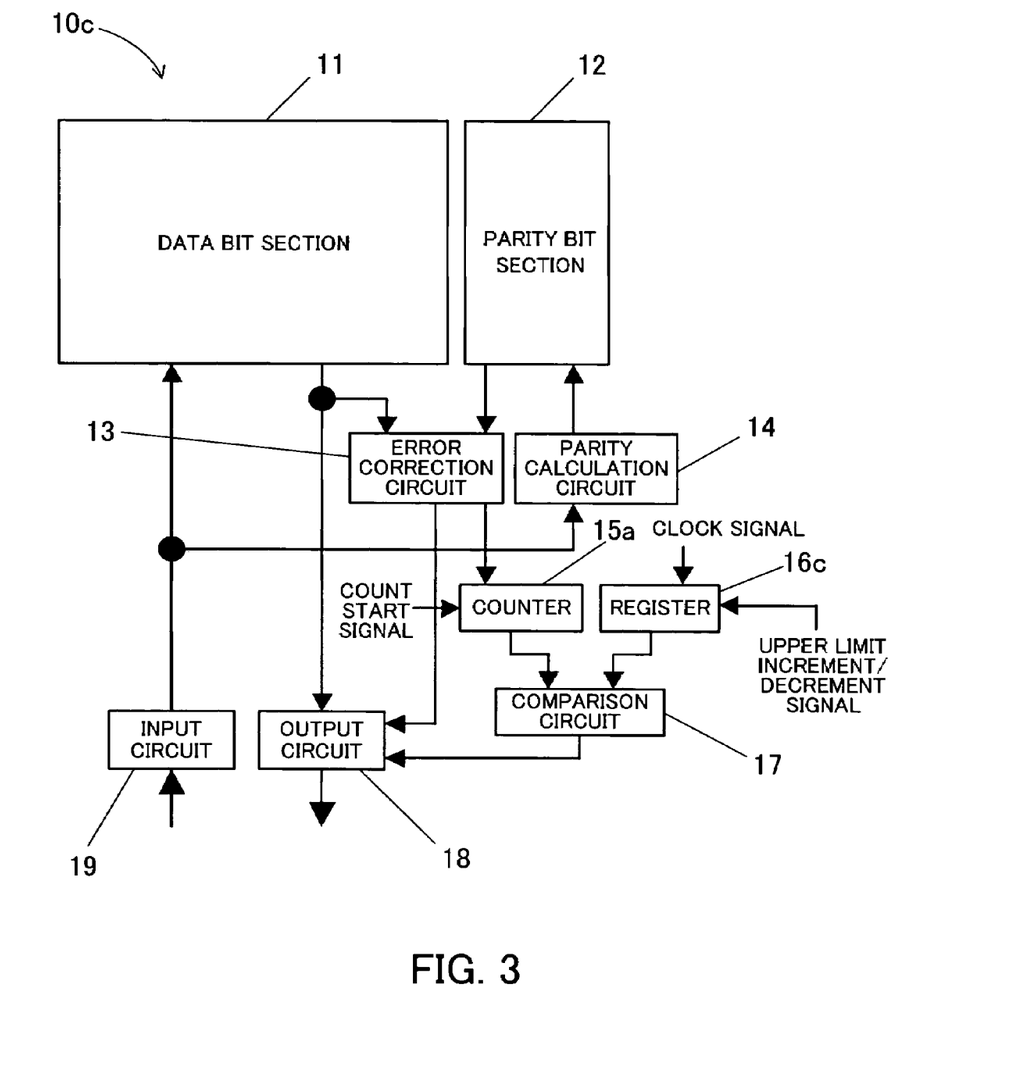
FIG. 3 shows a configuration of a semiconductor memory device according to a third embodiment of the present invention.

FIG. 3 shows a configuration of the semiconductor memory device according to the third embodiment of the present invention.

In the diagram, the same elements as those in the semiconductor memory devices 10a and 10b of the first and second embodiments are indicated by the same reference numerals as those in the devices 10a and 10b and the description is omitted.

In the semiconductor memory device 10c of the third embodiment, the register 16c is different from the register 16a in the semiconductor memory device 10a of the first embodiment. When the upper limit setting signal (referred to as an "upper limit increment/decrement signal" in the third embodiment) is externally inputted (goes to a high level), the register 16c increments or decrements the upper limit in synchronization with a clock signal.

Operations of the semiconductor memory device loc of the third embodiment are described below. Operations during the reading and the writing are the same as those in the semiconductor memory devices 10a and 10b of the first and second embodiments and the description is omitted.

During the test operation, after completion of counting of the number of error corrections by the counter 15a, when the upper limit increment/decrement signal goes to, for example, a high level, the register 16c increments or decrements the previously stored upper limit in synchronization with a clock signal. On each occasion, the comparison circuit 17 compares the count result of the number of error corrections with the upper limit. For example, when no alarm is generated, the upper limit is decremented. By doing so, the upper limit is made smaller than the count result of the number of error corrections on reaching a certain value. As a result, an alarm is generated. On the other hand, when an alarm is generated, the upper limit is incremented. By doing so, the upper limit exceeds the count result of the number of error corrections on reaching a certain value. As a result, no alarm is generated. That is, details of the number of error corrections can be grasped based on the signal outputted from the comparison circuit 17.

In addition, the semiconductor memory device 10a of the first embodiment may be configured as follows. After completion of the counting of the number of error corrections by the counter 15a, the upper limit increment/decrement signal is inputted to the register 16a, so that the details of the number of error corrections may be grasped.

Next, a semiconductor memory device of a fourth embodiment is described.

Figure 4:
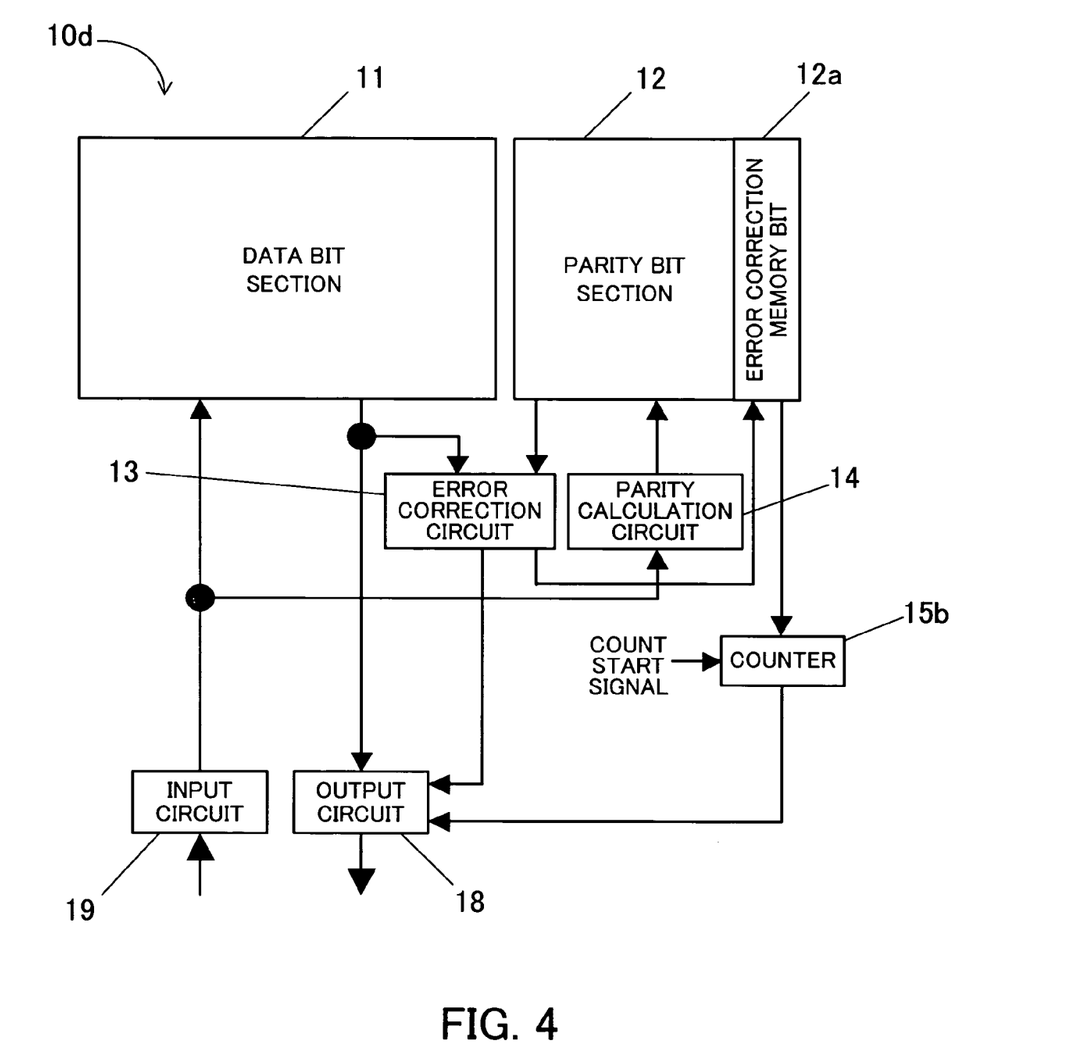
FIG. 4 shows a configuration of a semiconductor memory device according to a fourth embodiment of the present invention.

FIG. 4 shows a configuration of the semiconductor memory device of the fourth embodiment.

In the diagram, the same elements as those in the semiconductor memory devices 10a, 10b and 10c of the first to third embodiments are indicated by the same reference numerals as those in the devices 10a, 10b and 10c and the description is omitted.

The semiconductor memory device 10d of the fourth embodiment has the following function. When performing a test using a test pattern that the same address data are accessed two or more times, a defective bit is prevented from being counted two or more times. In order to realize the function, the semiconductor memory device 10d has an error correction memory bit 12a. The bit 12a stores error correction information of whether or not an error correction is performed, at every combination of the data bits and parity bits which are required to construct the ECC code (e.g., a hamming code) capable of 1-bit error correction. A counter 15b, when a count start signal is inputted, counts the number of error corrections based on the error correction information stored in the error correction memory bit 12a.

The memory cell array is generally configured by a 4-bit or 8-bit unit. That is, four or eight memory cells are selected on one column selection line. For example, in the case where the array is configured by a 8-bit unit, when the hamming code is constructed using 7 parity bits to 64 data bits, a surplus of 1 bit occurs because 7 bits are required for the storage of the parity bits. Consequently, the surplus of 1 bit is allocated to the error correction memory bit 12a, so that the function can be realized without increase of the memory cell array.

Operations of the semiconductor memory device 10d of the fourth embodiment are described below.

Operations during the reading and the writing are the same as those in the semiconductor memory devices 10a, 10b and 10c of the first to third embodiments and the description is omitted.

During the test operation, the semiconductor memory device 10d first accesses all the address data of a memory cell array and then performs 1-bit error detection and 1-bit error correction using the error correction circuit 13.

Figure 5:
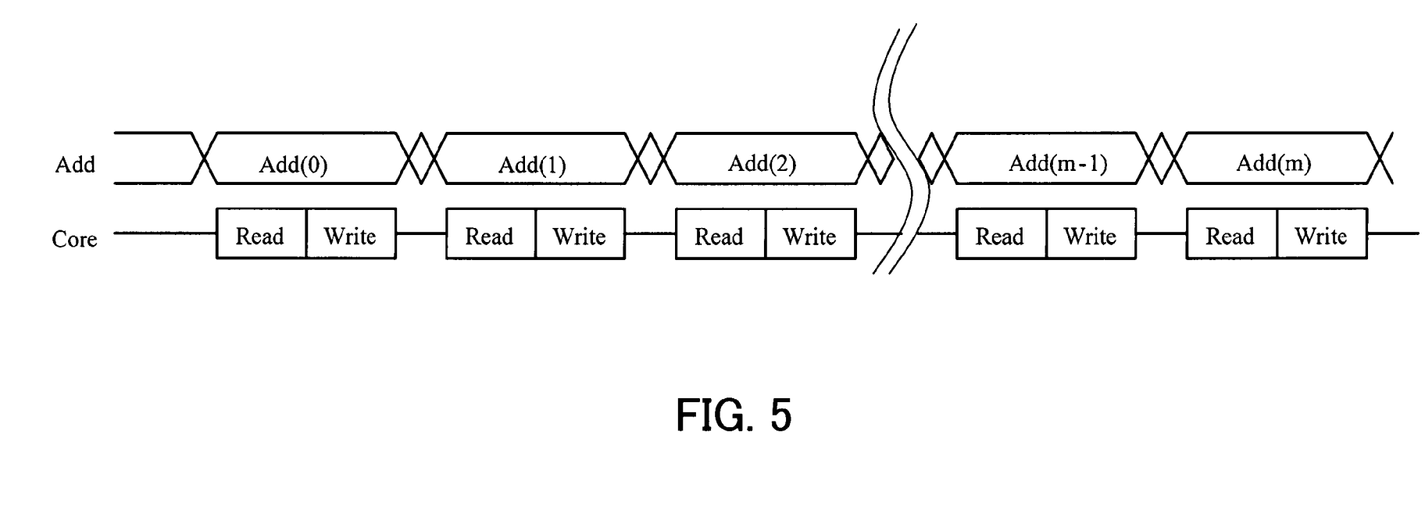
FIG. 5 is a timing chart showing a state of writing of error correction information into an error correction memory bit.

FIG. 5 is a timing chart showing a state of writing of error correction information into an error correction memory bit.

Herein, an address Add (0) is first selected. Then, a read-out operation from the memory core (Core) is performed, for example, at every combination of 64 data bits and 7 parity bits, whereby 1-bit error detection and 1-bit error correction are performed by the error correction circuit 13. The result is written, as the error correction information, into the error correction memory bit 12a of the memory core. For example, when the error correction is performed, "1" is stored in the memory bit 12a, and when the error correction is not performed, "0" is stored in the memory bit 12a. When performing the above-described processing for all of the addresses Add (1), Add (2), . . . , Add (m−1) and Add (m), all the address data are accessed, whereby the error correction information is written into the error correction memory bit 12a.

Figure 6:
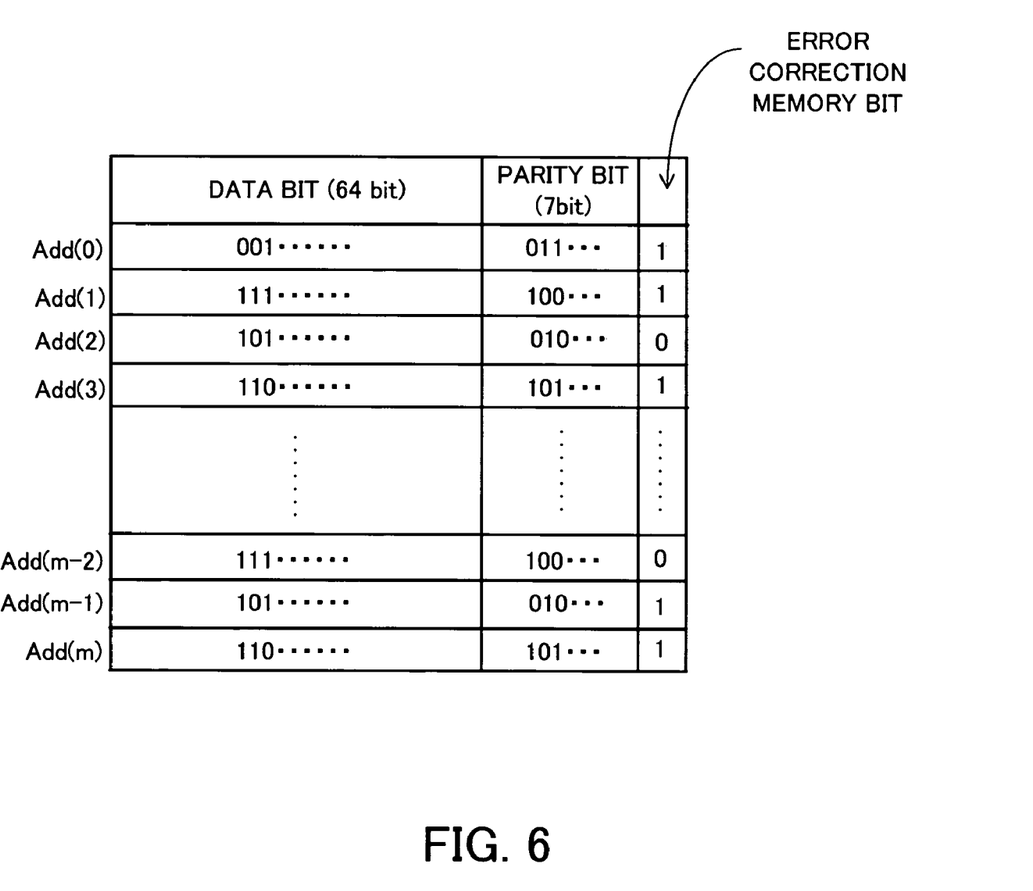
FIG. 6 shows a storage state of a memory core after the writing of error correction information into an error correction memory bit.

FIG. 6 shows a storage state of the memory core after completion of writing of the error correction information into the error correction memory bit.

Error correction information of whether or not an error correction is performed is stored at every combination of the 64 data bits and 7 parity bits which are required to construct the ECC code capable of 1-bit error correction. When the error correction is performed, "1" is stored in the error correction memory bit, and when the error correction is not performed, "0" is stored in the error correction memory bit.

Next, operations at the time of counting the number of error corrections are described.

Figure 7:
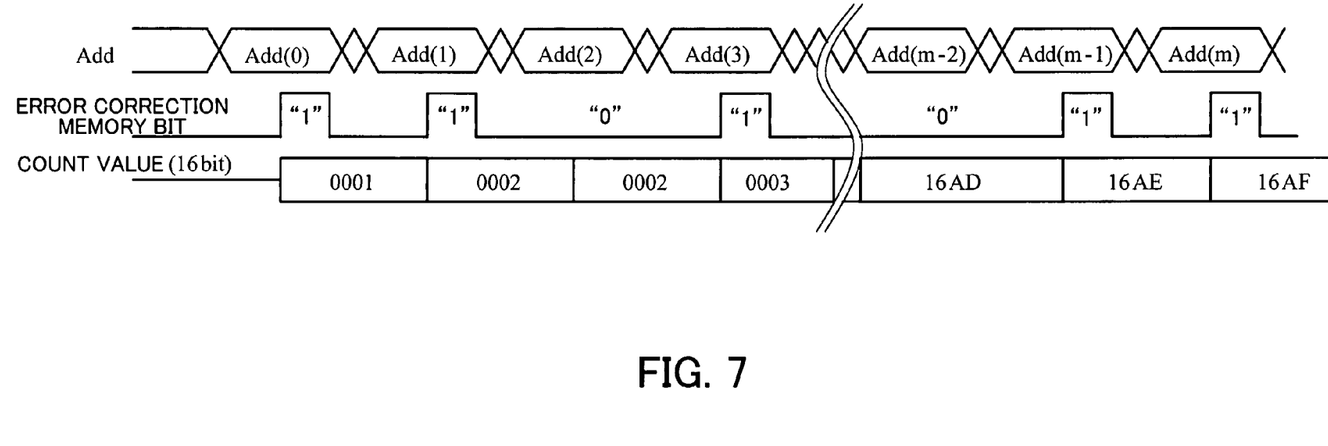
FIG. 7 is a timing chart showing a state of read-out of an error correction memory bit and a state of counting of the number of error corrections.

FIG. 7 is a timing chart showing a state of read-out of an error correction memory bit and a state of counting of the number of error corrections.

For example, when the count start signal is inputted into the counter 15b, all of the addresses Add (0) to Add (m) are continuously selected for the read-out operation. As a result, data of the error correction memory bit 12a are read out inside the memory core (not shown). The counter 15b counts up only when the datum of the error correction memory bit 12a is stored using "1" which means that the error correction is performed. FIG. 7 shows that as a result of the counting, the number of errors is 5807 (16AF in a hexadecimal number). The count result is outputted through the output circuit 18.

In a normal test pattern, each access to all the address data is repeated two or more times. Therefore, when the number of error corrections is directly counted by the counter 15b, the same address is carelessly counted two or more times. As a result, there arises a problem that the correct number of error corrections cannot be grasped. However, in the semiconductor memory device 10d of the fourth embodiment, the error correction memory bit 12a is used. Therefore, even if the error correction in the same address is performed two or more times, "1" is just overwritten into the error correction memory bit. Accordingly, when counting up this number, the correct number of error corrections can be counted.

Next, a semiconductor memory device of a fifth embodiment is described.

Figure 8:
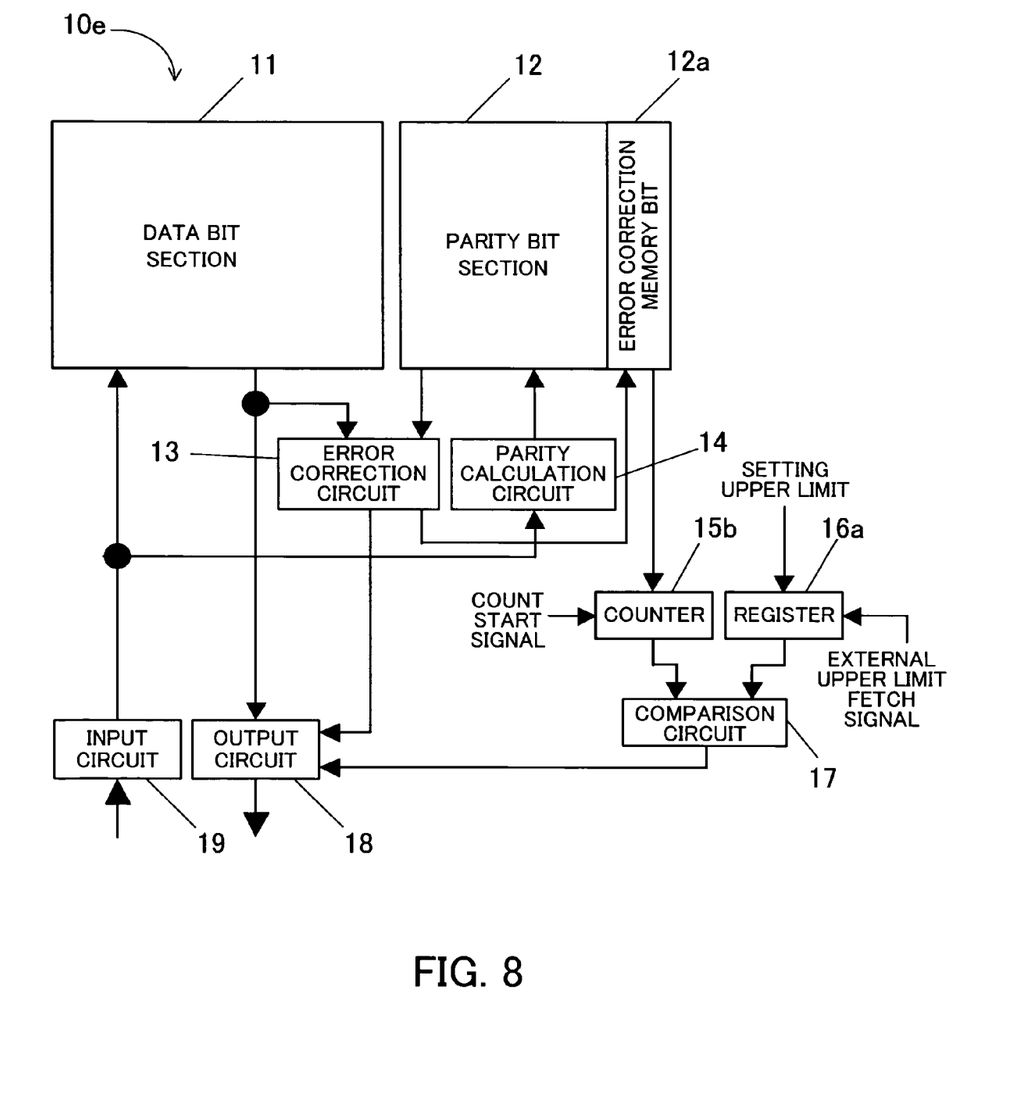
FIG. 8 shows a configuration of a semiconductor memory device according to a fifth embodiment of the present invention.

FIG. 8 shows a configuration of the semiconductor memory device of the fifth embodiment.

In the diagram, the same elements as those in the semiconductor memory devices 10a, 10b, 10c and 10d of the first to fourth embodiments are indicated by the same reference numerals as in the devices 10a, 10b, 10c and 10d and the description is omitted.

The semiconductor memory device 10e of the fifth embodiment has a configuration that the upper limit setting register 16a and comparison circuit 17 shown in the semiconductor memory device 10a of the first embodiment are added to the semiconductor memory device 10d of the fourth embodiment.

According to the configuration as described above, the upper limit set in the register 16a can be arbitrarily reset in response to the count result of the correct number of error corrections.

In addition, the semiconductor memory device 10e of the fifth embodiment may be further configured as follows. The count value memory signal as shown in FIG. 2 is allowed to be inputted into the register 16a. When the signal goes to a high level, the register 16a stores the count result by the counter 15a instead of externally fetching the setting upper limit. As a result, deterioration with time can be more correctly grasped.

According to the present invention, the upper limit of the number of error corrections can be changed in response to the upper limit setting signal inputted externally. Therefore, the upper limit of the number of error corrections can be arbitrarily set, for example, in response to the number of error corrections during the test operation.

Further, when the upper limit setting signal is inputted externally, the count result of the number of error corrections in the counter is set as the upper limit of the number of error corrections. Then, the upper limit and the count result after passing of a predetermined time are compared. Therefore, deterioration with time of the memory cell can be grasped.

Further, after completion of the counting of the number of error corrections, when the upper limit setting signal is inputted externally, the upper limit is incremented or decremented in synchronization with the clock signal. Then, the count result and the upper limit are compared. Therefore, details of the number of error corrections can be grasped by a signal from the comparator.

Further, an error correction storage section is provided in which the error correction information of whether or not an error correction is performed is stored at every combination of the data bits and parity bits required to construct a code capable of 1-bit error correction. Therefore, there can be solved a problem that at the time of counting the number of error corrections, the error correction in the same address is performed two or more times, so that the correct number of error corrections cannot be grasped, depending on the test pattern.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device having an error correction function of correcting a defective bit, comprising:
   a counter that counts the number of error corrections;
   an upper limit setting section that changes an upper limit of the number of error corrections in response to an upper limit setting signal inputted externally;
   a comparator that compares the number of error corrections with the upper limit; and
   an output section that generates an alarm if the number of error corrections reaches the upper limit during a test operation, wherein the upper limit setting section changes the upper limit according to generation of the alarm, and then detects an approximate number of error corrections based on whether or not the generation of the alarm has changed, and resets the upper limit.

2. The semiconductor memory device according to claim 1, wherein the upper limit setting signal is a signal for allowing a change of the upper limit during a test operation.

3. The semiconductor memory device according to claim 1, wherein the upper limit setting section, when the upper limit setting signal is inputted, sets a count result of the number of error corrections in the counter as the upper limit, and wherein
   the comparator compares the upper limit with the count result in the counter after the passing of a predetermined time.

4. The semiconductor memory device according to claim 1, wherein
   the upper limit setting section, when the upper limit setting signal is inputted after completion of counting in the counter, increments or decrements the upper limit in synchronization with a clock signal, and wherein
   the comparator compares the count result in the counter with the upper limit.

5. The semiconductor memory device according to claim 1, further comprising:
   an error correction memory section that stores error correction information of whether or not the error correction is performed, at every combination of data bits and parity bits required to construct a code capable of 1-bit error correction, wherein
   the counter counts the number of error corrections based on the error correction information.

* * * * *